United States Patent
Larsen et al.

(10) Patent No.: US 6,628,552 B1
(45) Date of Patent: *Sep. 30, 2003

(54) SELF-CONFIGURING INPUT BUFFER ON FLASH MEMORIES

(75) Inventors: Robert E. Larsen, Shingle Springs, CA (US); Harry Q. Pon, Sacramento, CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/834,029

(22) Filed: Apr. 11, 1997

(51) Int. Cl.[7] .............................................. G11C 16/04
(52) U.S. Cl. ............................ 365/189.05; 365/185.05; 365/185.33; 365/230.06
(58) Field of Search ....................... 365/189.05, 230.06, 365/185.05, 185.33

(56) References Cited

U.S. PATENT DOCUMENTS

| | | | |
|---|---|---|---|
| 4,313,064 A | 1/1982 | Claude | 307/475 |
| 4,439,804 A | 3/1984 | Riddle et al. | |
| 4,617,479 A | * 10/1986 | Hartmann et al. | 307/465 |
| 4,774,421 A | * 9/1988 | Hartmann et al. | 307/465 |
| 4,975,883 A | 12/1990 | Baker et al. | |
| 5,153,452 A | 10/1992 | Iwamura et al. | 307/296.1 |
| 5,223,751 A | 6/1993 | Simmons et al. | 307/475 |
| 5,268,599 A | 12/1993 | Matsui | 307/475 |
| 5,283,762 A | 2/1994 | Fujishima | 365/189.09 |
| 5,298,807 A | 3/1994 | Salmon et al. | 307/475 |
| 5,323,357 A | * 6/1994 | Kaneko | 365/230.06 |
| 5,373,479 A | * 12/1994 | Noda | 365/230.06 |
| 5,444,392 A | 8/1995 | Sommer et al. | 326/31 |
| 5,477,172 A | 12/1995 | Schnizlein | 327/99 |
| 5,497,119 A | 3/1996 | Tedrow et al. | |
| 5,528,172 A | 6/1996 | Sundstrom | 326/80 |
| 5,532,620 A | 7/1996 | Seo et al. | 326/81 |
| 5,534,801 A | 7/1996 | Wu et al. | 327/72 |
| 5,561,627 A | * 10/1996 | Matsubara et al. | 365/185.04 |
| 5,568,062 A | 10/1996 | Kaplinsky | 326/27 |
| 5,592,104 A | 1/1997 | Bach | 326/27 |
| 5,594,369 A | 1/1997 | Kondoh et al. | 326/83 |
| 5,650,967 A | 7/1997 | Seibert | 365/185.33 |
| 5,663,914 A | * 9/1997 | Kwon | 365/202 |
| 5,687,122 A | * 11/1997 | Merritt | 365/189.05 |
| 5,896,338 A | 4/1999 | Landgraf et al. | |
| 5,903,500 A | * 5/1999 | Tsang et al. | 365/189.05 |
| 5,933,026 A | * 8/1999 | Larsen et al. | 326/81 |

FOREIGN PATENT DOCUMENTS

WO  WO 95/09483 A  4/1995

* cited by examiner

Primary Examiner—Richard Elms
Assistant Examiner—Hien Nguyen
(74) Attorney, Agent, or Firm—Blakely, Sokoloff, Taylor & Zafman LLP

(57) ABSTRACT

A low-power input buffer for a nonvolatile writeable memory is described. The low-power input buffer accepts input signals having one of a number of pairs of logic levels. The low-power input buffer provides output signals having a pair of logic levels that may differ from the logic levels of the input signal. The low-power input buffer comprises an inverter that receives an input signal, a circuit with a relatively low voltage drop, and a feedback pull-up device. The circuit with the relatively low voltage drop causes the low-power input buffer to accept input signals having one pair of logic levels while providing signals that may have a different pair of logic levels. The feedback pull-up device prevents the low-power input buffer from drawing leakage current. The low-power input buffer is coupled to the nonvolatile writeable memory and coupled to the same power supply output as the nonvolatile writeable memory. The low-power input buffer uses input signals having logic levels compatible with complementary metal-oxide semiconductor (CMOS) technology.

31 Claims, 6 Drawing Sheets

| I/O CONFIGURATION OR USEAGE | V_CCQ (INPUTS/CORE) | V_CCQ (OUTPUTS) |
|---|---|---|
| 1.8 I/Os  302 | 2.7 - 2.85 VOLTS  306 | 1.8 - 2.2 VOLTS  304 |
| 3.0 I/Os  312 | 3.0 VOLTS  316 | 3.0 VOLTS  314 |

SELF-CONFIGURING INPUT BUFFER ON FLASH MEMORIES

FIELD OF THE INVENTION

This invention relates to systems including nonvolatile writeable memory. More particularly, this invention relates to interfacing a nonvolatile writeable memory device to an electronic system application.

BACKGROUND OF THE INVENTION

Many computing systems such as personal computers, automotive and airplane control, cellular phones, digital cameras, and handheld communication devices use nonvolatile writeable memories to store either data, or code, or both. Such nonvolatile writeable memories include Electrically Erasable Programmable Read-Only Memories ("EEPROMs") and flash Erasable and Electrically Programmable Read-Only Memories ("flash EPROMs" or "flash memories"). Nonvolatility is advantageous for allowing the computing system to retain its data and code when power is removed from the computing system. Thus, if the system is turned off or if there is a power failure, there is no loss of code or data.

The nonvolatile writeable memories often include a plurality of interconnected very large scale integration (VLSI) circuits. These VLSI circuits dissipate power in proportion to the nominal voltage swing of the binary signals applied to the circuits. The industry standard VLSI complementary metal-oxide-semiconductor (CMOS) circuits currently utilize two levels of input/output (I/O) signals, 1.8 volts and 3.0 volts. Generally, in those circuits utilizing the 1.8 volt signal level, a logic low state (logic "0") is represented by a signal level of 0 volts, and a logic high state (logic "1") is represented by a signal level of 1.8 volts. Generally, in those circuits utilizing the 3.0 volt signal level, a logic low state (logic "0") is represented by a signal level of 0 volts, and a logic high state logic "1") is represented by a signal level of 3.0 volts. Therefore, the VLSI CMOS circuits are attractive for use in digital circuits because of lower power consumption. As the rail-to-rail voltage swing of standard CMOS circuits utilizing the 3.0 volt signal level tends to cause such circuits to dissipate excessive amounts of power and energy over CMOS circuits utilizing the 1.8 volt signal level, the 1.8 volt CMOS circuit would be preferred in an application requiring reduced power consumption.

With the size of many electronic products becoming increasingly smaller, many electronic product designers are currently seeking to minimize power consumption. Generally, reducing the overall magnitude of rail-to-rail voltage swings of CMOS circuits allows a reduction in power consumption. Thus, an electronic architecture that would allow and work with lower input voltage swings without drawing leakage current is desirable. However, certain applications of CMOS circuits are actually more efficient in terms of power consumption when operated at higher signal levels. For example, CMOS circuits configured as nonvolatile writeable memory core circuits have better power efficiency when operated at the 3.0 volt I/O signal level and supply voltage compared to those operated at the 1.8 volt I/O signal level and supply voltage. This increased efficiency at the higher I/O signal voltage level is a result of the charge pumps required by the nonvolatile writeable memory. Consequently, an electronic system architectural concept is desired whereby the nonvolatile writeable memory circuits would be allowed to operate with industry standard 1.8 volt and 3.0 volt CMOS I/O signal levels and utilize the optimum core supply voltage for the nonvolatile writeable memory core circuits.

Designers of prior art electronic systems incorporating nonvolatile writeable memory have attempted to reduce the overall system power consumption by running the entire system at the 1.8 volt I/O signal level and supply voltage. This increases the power consumption efficiency of the system exclusive of the nonvolatile writeable memory. However, the nonvolatile writeable memory core memory circuits running at the 1.8 volt I/O signal level have a reduced power consumption efficiency. Thus, to effectively maximize efficiency of the overall electronic system, I/O interface buffers are required which allow the nonvolatile writeable memory core memory circuits to be operated at a 3.0 volt I/O signal level, while the surrounding system CMOS circuitry is operated at a 1.8 volt I/O signal level. The 3.0 volt I/O nominal signal level can be approximately in the range 2.7 volts to 3.6 volts.

Designers of prior art I/O interface circuitry have attempted to use 1.8 volt I/O signal level buffers while running the nonvolatile writeable memory core memory circuits at a 3.0 volt I/O signal level. Regarding the input buffer portion of the I/O interface, the prior art CMOS input buffers have the input high signal level equal to or within some tolerable specifications to a supply voltage. For the 1.8 volt I/O signal level input buffers, the input high value is substantially lower than the input buffer supply voltage which is typically 3.0 volts. This difference between the input buffer supply voltage, which is also the core supply voltage, and input high voltage signal level, is the source of current leakage and unstable operation of the input buffer.

Furthermore, this current leakage problem limits the flexibility of use of the I/O interface circuitry. This is because anytime there is a difference between the supply voltage and the input high voltage signal level there will be current leakage. Therefore, an input buffer configured to operate with a 1.8 volt I/O signal level cannot be used in a system utilizing 3.0 volt I/O signal levels, and vice versa. This requires separate input buffer configurations to be made available for use in each of the 1.8 and 3.0 volt I/O signal level systems. Moreover, the user does not have the option to run at the higher 3.0 volt CMOS input signal level once a circuit is configured to operate at the 1.8 volt input signal level.

Designers of prior art I/O interface circuitry have attempted to solve this current leakage problem by using one power supply for the 1.8 volt input buffer and a separate power supply for the non-volatile writeable memory core memory circuits operating at the 3.0 volt signal level. This is problematic in that the limits of size and weight imposed by many electronic applications using nonvolatile writeable memory circuits do not allow for the use of more than one power supply.

Regarding the output buffer portion of the I/O interface, the prior art CMOS output buffers have p-channel CMOS drivers, or voltage level pull-ups, driving the output high level equal to or within some tolerable specifications to the supply voltage. For the 1.8 volt I/O signal level output buffers, the lower voltage power supply limits the internal drive capability to meet higher output speed and load requirements in driving a voltage output high level.

Another limitation found in prior art I/O circuitry which can have a significant adverse impact in particular applications is the electrical noise generated by the circuit configuration. In a prior art configuration using a single power supply, the interface circuitry input buffer, nonvolatile writeable memory core memory circuits, and the interface circuitry output buffer of the system are all connected to the same power supply output. In a prior art configuration using separate power supplies for the I/Os and the nonvolatile writeable memory core circuits, the input buffer and the output buffer are connected to the same power supply output. Consequently, in both configurations, the isolation between the input and the output is reduced by having the input and the output connected to the same power supply output. This configuration significantly reduces the noise immunity of the system. This problem is compounded when a system is operated at the 1.8 volt I/O signal level because, at this signal level, the noise margin is decreased. This noise can have significant adverse impacts on performance, particularly in cellular phone applications.

SUMMARY OF THE INVENTION

A low-power input buffer for a nonvolatile writeable memory is described. The low-power input buffer accepts input signals having one of a number of pairs of logic levels. The low-power input buffer provides output signals having a pair of logic levels that may differ from the logic levels of the input signal.

Other features and advantages of the present invention will be apparent from the accompanying drawings and from the detailed description and appended claims that follow below.

BRIEF DESCRIPTION OF THE DRAWINGS

The present invention is illustrated by way of example and not limitation in the figures of the accompanying drawings, in which like references indicate similar elements and in which:

FIG. 3 shows the power supply combination supplied to an embodiment of a nonvolatile writeable memory.

DETAILED DESCRIPTION

Nonvolatile writeable memory interface circuits that are self-configuring to multiple CMOS input/output signal level specifications will provide low power consumption and prevent current leakage at both signal levels while using a common core power supply. Accordingly, a low-power input buffer is provided for nonvolatile writeable memory that is self-configuring to multiple CMOS input/output (I/O) signal levels.

Figure 1:
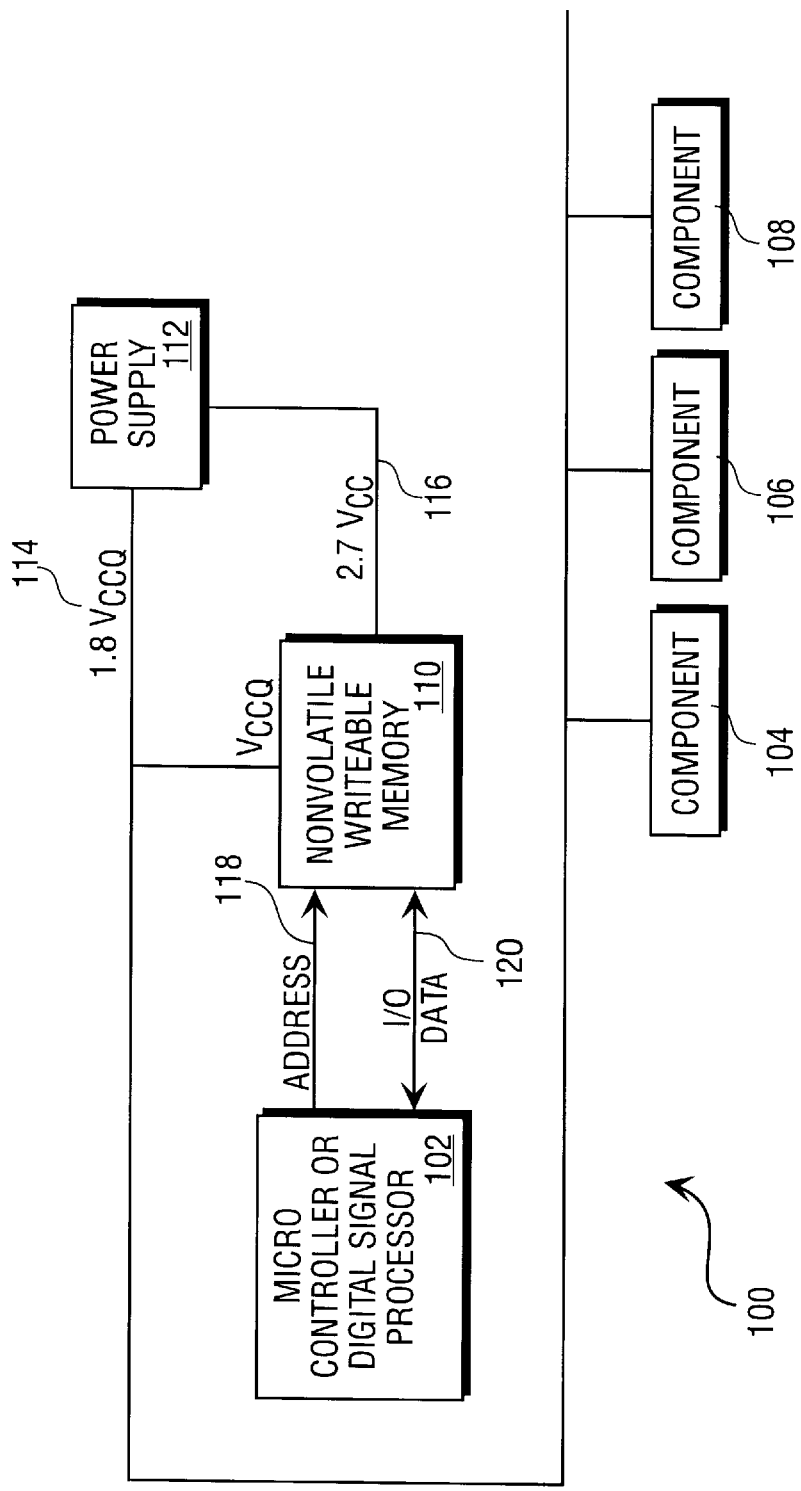
FIG. 1 shows a block diagram of a system level application including nonvolatile writeable memory.

FIG. 1 shows a block diagram of a system level application including a nonvolatile writeable memory. This application includes a microcontroller or digital signal processor 102 and system components 104–108. System components 104–108 can be any other electronic components of the system 100 which, for example, might include but is not limited to additional memory components like static random access memory (SRAM), EPROM, and EEPROM. The microcontroller 102 communicates with the nonvolatile writeable memory 110 via address lines 118 and input/output (I/O) data lines 120. A first output of a single power supply 112 provides a 1.8 volt supply (VCCQ) 114 to an interface circuit of the nonvolatile writeable memory 110 as well as to the system microcontroller 102, and system components 104–108. A second output of the power supply 112 provides a 2.7 volt supply (VCC) 116 to the core memory circuits of the nonvolatile writeable memory 110.

Figure 2:
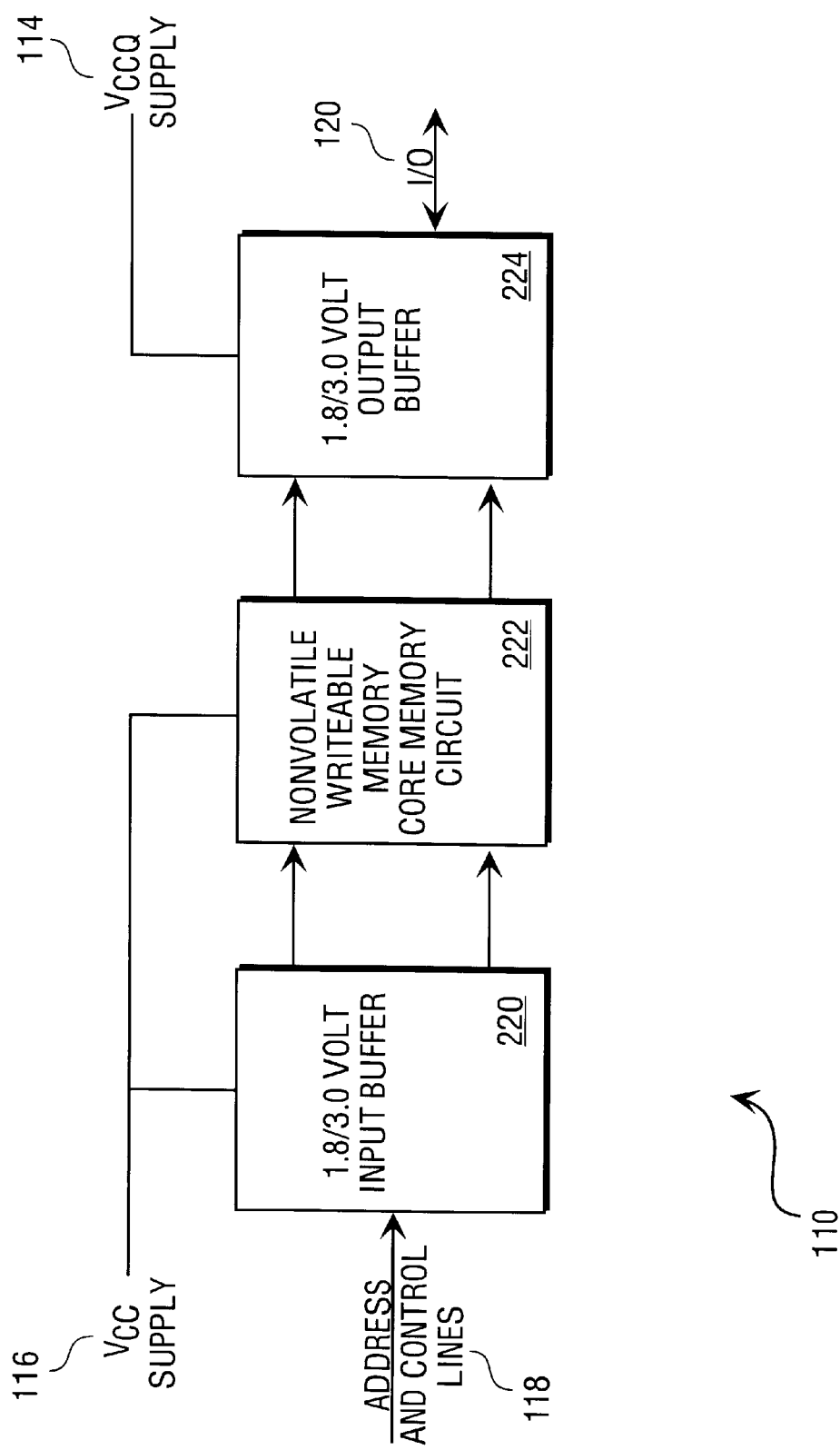
FIG. 2 shows a block diagram of a nonvolatile writeable memory.

FIG. 2 shows a block diagram of a nonvolatile writeable memory 110. This embodiment depicts the nonvolatile writeable memory 110 as being comprised of a core memory circuit 222 and interface circuitry. The core memory circuit 222 includes, but is not limited to, a command register, a write state machine, a resolution circuit, read/write circuits, and a memory cell array (not shown). The interface circuitry is comprised of a 1.8/3.0 volt input buffer 220 and a 1.8/3.0 volt output buffer 224.

An electronic system is coupled to the nonvolatile writeable memory 110 with address and control lines 118 which are coupled to the input buffer 220. The input buffer 220 is coupled to the core memory circuit 222. The core memory circuit 222 is coupled to the output buffer 224. The output buffer 224 is coupled to an electronic system using I/O data lines 120.

With regard to power supply connections, the input buffer 220 and the core memory circuit 222 are each coupled to a VCC power supply output 116. The output buffer 224 is coupled to a VCCQ power supply output 114. The VCC power supply output 116 and the VCCQ power supply output 114 in combination power the nonvolatile writeable memory 110 and the electronic system in which the nonvolatile writeable memory 110 is resident.

FIG. 3 shows the power supply combination 300 supplied to an embodiment of a nonvolatile writeable memory circuit by the VCC power supply output 116 and the VCCQ power supply output 114. The interface circuitry of an embodiment of the nonvolatile writeable memory circuit, including the input buffer 220 and the output buffer 224, is self-configuring to operate with a number of sets of signal levels. These signal levels are generally compatible with complementary metal-oxide semiconductor (CMOS) technology. For example, the nonvolatile writeable memory circuit can utilize a signal having either a 1.8 volt or a 3.0 volt signal level. When utilizing the 1.8 volt signal level, a logic low state (logic "0") is represented by a signal level of 0 volts, and a logic high state (logic "1") is represented by a signal level of 1.8 volts. When utilizing the 3.0 volt signal level, a logic low state (logic "0") is represented by a signal level of 0 volts, and a logic high state (logic "1") is represented by a signal level of 3.0 volts.

With reference to FIGS. 2 and 3, when the interface circuitry including the input buffer 220 and the output buffer 224 is configured to utilize a 1.8 volt CMOS signal 302, the VCC power supply output 116 to the input buffer 220 and the core memory circuit 222 is approximately in the range of 2.7 to 2.85 volts 306, and the VCCQ power supply output 114 to the output buffer 224 is approximately in the range of 1.8 to 2.2 volts 304. When the interface circuitry including the input buffer 220 and output buffer 224 is configured to utilize a 3.0 volt CMOS signal 312, the VCC power supply output 116 to the input buffer 220 and the core memory circuit 222 is substantially equal to 3.0 volts 316, and the VCCQ power supply output 114 to the output buffer 224 is substantially equal to 3.0 volts 314.

Figure 4:
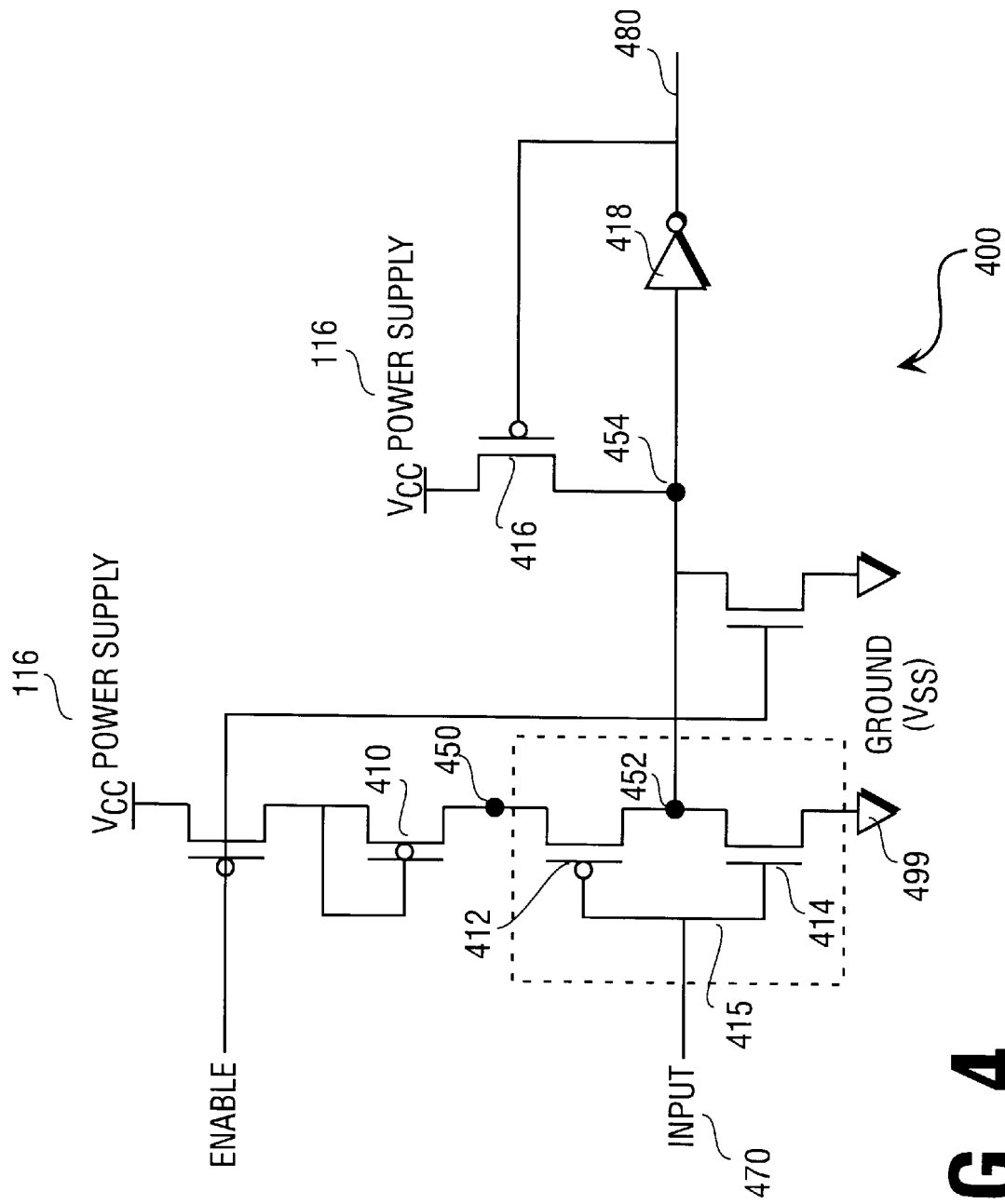
FIG. 4 shows a schematic of an embodiment of an interface circuit input buffer of a nonvolatile writeable memory.
Figure 5:
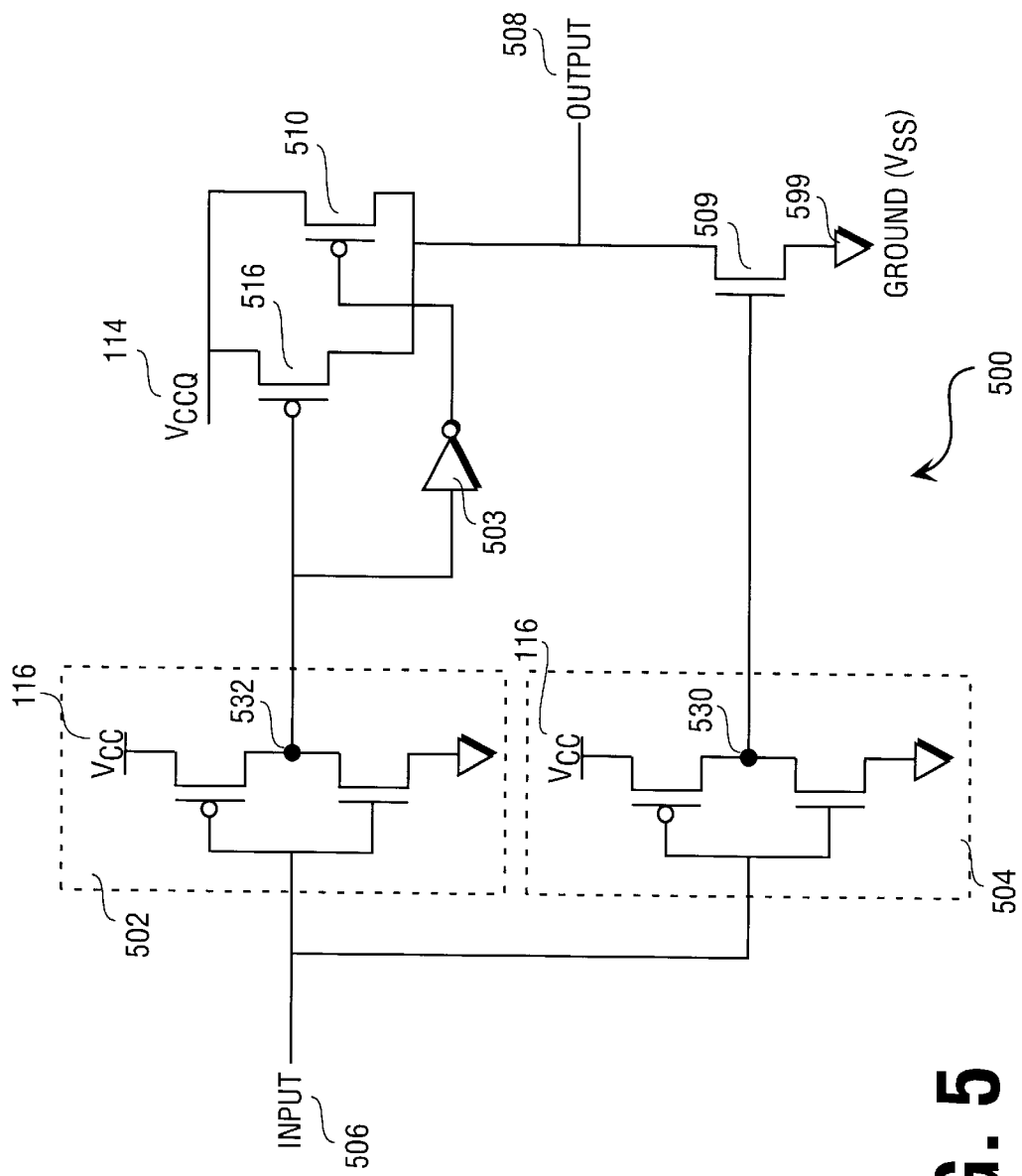
FIG. 5 shows a schematic of an embodiment of an interface circuit output buffer of a nonvolatile writeable memory.
Figure 6:
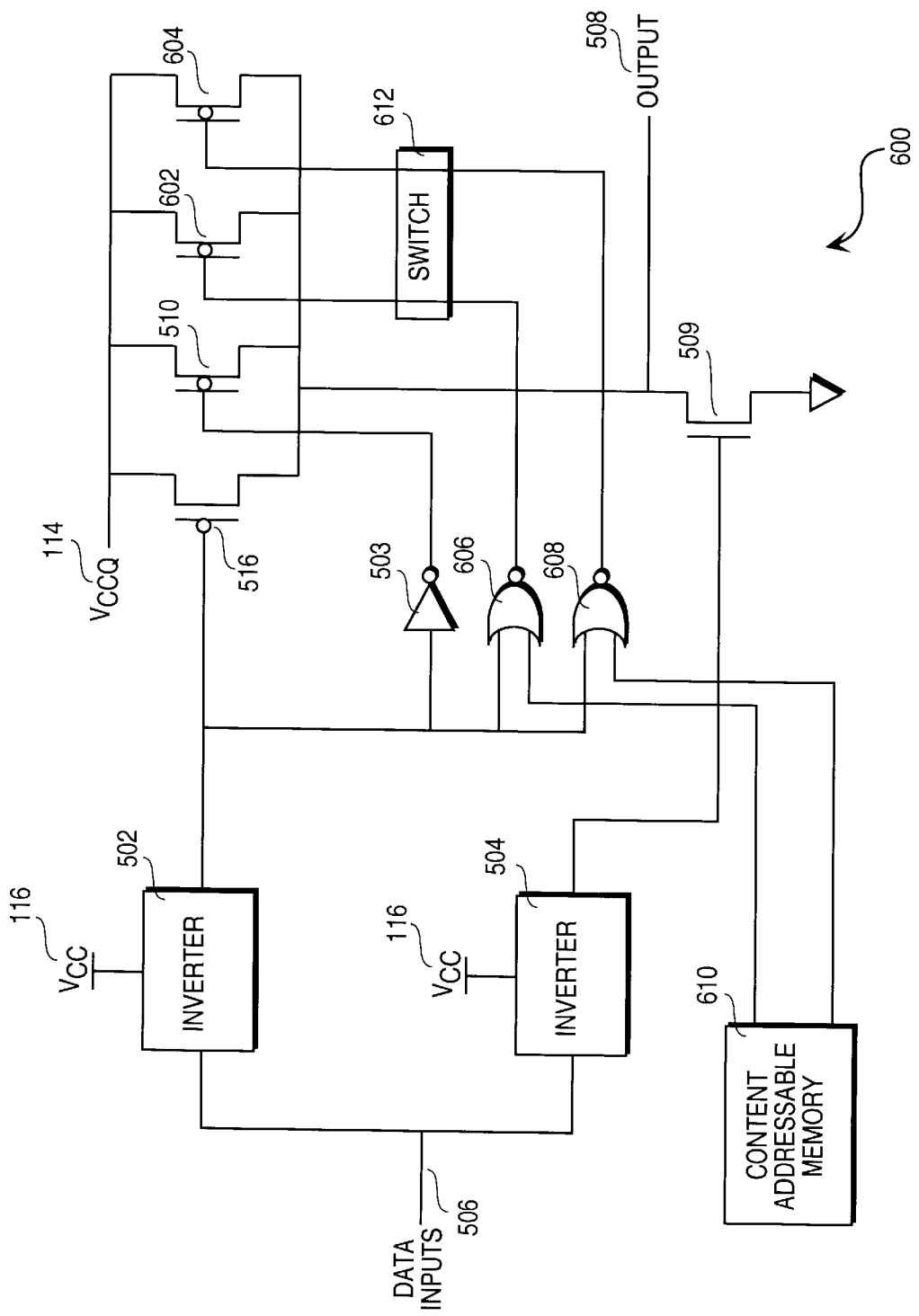
FIG. 6 shows a schematic of an alternate embodiment of an interface circuit output buffer of a nonvolatile writeable memory.

FIGS. 4, 5, and 6 show schematics of embodiments of an interface circuit input buffer and output buffers of a nonvolatile writeable memory. In these figures, all transistors are of the CMOS type, with a bubble at the gate indicating a p-channel device, a bubble in the gate indicating what will be referred to herein as an S device, and the absence of a bubble at the gate indicating an n-channel device. It is readily apparent that the circuitry described herein is not limited to CMOS devices. Furthermore, all values recited herein are approximated; it is contemplated that values in the range about the value recited are applicable.

FIG. 4 shows a schematic of an embodiment of an interface circuit input buffer 400 of a nonvolatile writeable memory. The input buffer 400 receives inputs 470 in the form of addresses from an electronic system microcontroller or processor. The inputs 470 are received at the gates of two transistors 412 and 414 which form an inverter 415. Transistor 412 is a p-channel device which has its drain coupled to transistor 414, an n-channel device, at node 452. Transistor 412 has its source coupled to the source of an S device 410 at node 450. The gate and drain of the S device 410 is coupled to a VCC power supply output 116 using an enable switch device.

The S device 410 is a high transconductance n-channel transistor that is specially doped to provide a threshold voltage that is lower than the threshold voltage of a standard n-channel CMOS device. In one embodiment, the S device is doped to have a threshold voltage of approximately 0.3 volts.

The inverter 415 is coupled to an input buffer driver 418 at node 452. The input buffer driver 418 is an inverter similar in electronic structure to input inverter 415. The output of the input buffer driver 418 is coupled to the gate of a p-channel device 416. The source of the p-channel device 416 is coupled to a VCC power supply output 161. The drain of the p-channel device 416 is coupled to the input of the input buffer driver 418 at node 454. The output of the input buffer driver 418 is the output 480 of the input buffer circuit 400.

The gate drive across a CMOS device is described relative to the difference in the voltage present at the gate and the voltage present at the source of the device, such voltage difference referred to as Vgs. The state of a transistor as "on" or "off" is determined by the relationship between the threshold voltage of the device, referred to as Vt, and Vgs. Accordingly, the device is considered to be "on" when Vgs is greater than Vt, and the device is considered to be "off" when Vgs is less than Vt.

In analyzing the operation of input buffer 400, the input buffer 400 is automatically configured to utilize both 1.8 volt and 3.0 volt signal levels without current leakage as a result of the S device 410. In the operation of the input buffer 400, leakage current results when devices 412 and 414 are "on", resulting in a current path from the power supply output 116 to ground 499. Therefore, either device 412 or 414 must be "off" in order to prevent leakage current from flowing. For a device to be "off", the Vgs of the device must be less than the Vt of the device. The Vt of a p-channel device like transistor 412 is approximately 1 volt. Therefore, the Vgs must be less than approximately 1 volt to insure the device is "off".

An analysis of input buffer 400 operating with a 1.8 volt input signal level follows. In the 1.8 volt I/O configuration, the VCC power supply output 116 is approximately 2.7 volts. The Vt of the S device 410 is approximately 0.3 volts. This 0.3 volt drop applied to the 2.7 volt power supply output 116 across the threshold of the S device 410 results in a voltage at node 450, the drain of device 412, of approximately 2.4 volts. A logic high signal received at the input 470 results in a signal level of approximately 1.8 volts at the gate of device 412. A gate voltage of 1.8 volts and a source voltage of 2.4 volts results in a Vgs of approximately 0.6 volts. This Vgs of 0.6 volts is less than the Vt of approximately 1.0 volt for the p-channel device 412 resulting in device 412 being "off". As device 412 is "off" there is no direct current path from the power supply output 116 to ground 499 and thus, no leakage current can flow when the input buffer 400 is operating with 1.8 volt I/O signal levels.

An analysis of input buffer 400 operating with a 3.0 volt input signal level follows. In the 3.0 volt I/O configuration, the VCC power supply output 116 is approximately 3.0 volts. The Vt of the S device is approximately 0.3 volts. This 0.3 volt drop applied to the 3.0 volt power supply output 116 across the threshold of the S device 410 results in a voltage at node 450 of approximately 2.7 volts. A logic high voltage signal received at the input 470 results in a signal level of approximately 3.0 volts at the gate of device 412. A gate voltage of 3.0 volts and a source voltage of 2.7 volts results in a Vgs of approximately 0.3 volts. This Vgs of 0.3 volts is less than the Vt of approximately 1.0 volt for the p-channel device 412 resulting in device 412 being "off". As device 412 is "off" there is no direct current path from the power supply output 116 to ground 499 and thus, no leakage current can flow when the input buffer 400 is operating with 3.0 volt I/O signal levels.

Therefore, the input buffer 400 can be operated at both 1.8 volt and 3.0 volt I/O signal levels without any required reconfiguration by the user; the input buffer 400 automatically responds to either input signal level configuration. While operating at either a 1.8 volt or a 3.0 volt input signal level, the input buffer 400 functions with the same power supply output 116 voltage as the nonvolatile writeable memory core memory circuits. While operating at either signal level, there is no current leakage because of the special threshold voltage of the S device 410. The S device 410 threshold voltage drops the VCC supply output 116 voltage to the inverter 415 such that when the input 470 is in a logic high state, all of the transistors in the input buffer stage are "off". The choice of this special threshold S device 410 is critical because the voltage drop it induces as a result of its threshold voltage turns the p-channel device 412 in the input buffer 400 completely "off" within the range of the input voltage specifications at both the 1.8 volt and 3.0 volt signal levels.

The input buffer driver 418 and feedback pull-up device 416 of the input buffer 400 function to translate the level of the signal received at the input 470 to the internal operating signal level of the nonvolatile writeable memory core memory circuits, approximately 2.7 volts. The input buffer driver 418 has an electrical configuration similar to inverter 415, being comprised of an n-channel and a p-channel device. Consequently, the same problem regarding leakage current as previously discussed with regard to inverter 415 applies to the input buffer driver 418.

As shown in the previous analysis, the voltage at node 450 is 2.4 volts when the input buffer 400 is operated at a 1.8 volt I/O signal level. This results in a voltage of 2.4 volts at nodes 452 and 454 when a logic low signal level is received at the input 470. This 2.4 volt signal is fed back through the input buffer driver 418 as a 0 volt signal. The 0 volt signal is applied to the gate of transistor 416. As the source of transistor 416 is coupled to the VCC power supply output 116, the voltage present at the source of transistor 416 is approximately 2.7 volts. Therefore, the Vgs of transistor 416 is 2.7 volts which is greater than the approximately 1.0 volt Vt of a p-channel device resulting in transistor 416 being turned "on". With transistor 416 "on", the voltage at node 454 is pulled up to 2.7 volts. As the source of the p-channel device of the input buffer driver 418 is coupled to a 2.7 volt VCC power supply output, the presence of a 2.7 volt signal level at the input of the input buffer driver 418 results in a Vgs of the p-channel device of the input buffer driver 418 of 0 volts which turns the device "off". As the device is "off" there is no direct current path from the power supply to ground so that no leakage current can flow in the input buffer driver 418 when the input buffer 400 is operated at a 1.8 volt I/O signal level.

As shown in the previous analysis, the voltage at node 450 is 2.7 volts when the input buffer 400 is operated at a 3.0 volt I/O signal level. This results in a voltage of 2.7 volts at nodes 452 and 454 when a logic low signal level is received at the input 470. This 2.7 volt signal is fed back through the input buffer driver 418 as a 0 volt signal. The 0 volt signal is applied to the gate of transistor 416. As the source of transistor 416 is coupled to the VCC power supply output 116, the voltage present at the source of transistor 416 is approximately 2.7 volts. Therefore, the Vgs of transistor 416 is 2.7 volts which is greater than the approximately 1.0 volt Vt of a p-channel device resulting in transistor 416 being turned "on". With transistor 416 "on", the voltage at node 454 is maintained at 2.7 volts. As the source of the p-channel device of the input buffer driver 418 is coupled to a 2.7 volt VCC power supply output, the presence of a 2.7 volt signal level at the input of the input buffer driver 418 results in a Vgs of the p-channel device of the input buffer driver 418 of 0 volts which turns the device "off". As the device is "off" there is no direct current path from the power supply to ground so that no leakage current can flow in the input buffer driver 418 when the input buffer 400 is operated at a 3.0 volt I/O signal level.

FIG. 5 shows a schematic of an embodiment of an interface circuit output buffer 500 of a nonvolatile writeable memory. The output buffer 500 receives inputs 506 in the form of data from a nonvolatile writeable memory core memory circuit. The inputs are received at the gates of two inverters 502 and 504. Each of the two inverters 502 and 504 are comprised of an n-channel and a p-channel device coupled together and coupled to a VCC power supply output 116, as previously discussed. The inverters 502 and 504 each function as previously discussed with regard to inverter 415 of the input buffer 400. Inverter 504 is coupled to the gate of an n-channel transistor 509 at node 530. The source of transistor 509 is coupled to the output 508 of the output buffer 500. Inverter 504 drives the voltage output low level signal with transistor 509.

Inverter 502 is coupled to the gate of a p-channel transistor 516 at node 532. Inverter 502 is also coupled to the input of inverter 503 at node 532. The output of inverter 503 is coupled to the gate of an S device 510. The characteristics of the S device 510 are the same as previously discussed for S devices. The sources of both the p-channel transistor 516 and the S device 510 are coupled to a VCCQ power supply output 114. The VCCQ power supply output 114 is as previously discussed. The drains of both the p-channel transistor 516 and the S device 510 are coupled to the output 508 of the output buffer 500. Inverter 502 drives the voltage output high level signal with the parallel combination of the p-channel transistor 516 and the S device 510.

An analysis of output buffer 500 operating with 1.8 volt I/O signal levels follows. In the 1.8 volt I/O configuration, the VCC power supply output 116 is approximately 2.7 volts. A logic high state signal at the input 506 of the output buffer 500 results in a logic low state signal at node 532, at the gate of the p-channel transistor 516, and at the input of inverter 503. The logic low state signal at the gate of the p-channel transistor 516 turns the p-channel transistor 516 "on" and allows the VCCQ power supply output 114 to drive the output 508 through the p-channel transistor 516. Simultaneously, the logic low state signal at the input of inverter 503 is translated into a logic high state signal by the inverter 503. The logic high state signal is coupled to the gate of the S device 510 thereby turning the S device 510 "on" and allowing the VCCQ power supply output 114 to simultaneously drive the output 508 through the S device 510.

In analyzing the operation of the output buffer 500 in driving the output 508 with a 1.8 volt signal, the p-channel transistor 516 and the S device 510 are coupled to the VCCQ power supply output 114 which provides a voltage level of approximately 1.8 volts. As a result of capacitive effects, the p-channel transistor 516 alone is limited in its internal drive capability to meet the higher output speed and load requirements associated with driving the 1.8 volt voltage output high level. This is because the high threshold voltage (approximately 1 volt) of the p-channel transistor 516 limits the driving potential of a 1.8 volt power source to approximately 0.8 volts. Thus, the high transconductance and low threshold voltage (approximately 0.3 volts) of the specially doped S device 510 are required to drive the output voltage to a high level of approximately 1.5 volts as fast as possible. After reaching a voltage level of approximately 1.5 volts, the S device 510 cuts off. The S device 510 cutoff allows the parallel p-channel transistor 516 to drive and sustain the remaining voltage output high level of 1.8 volts.

The separate VCC 116 and VCCQ 114 power supply output connections to the output buffer 500 enable the output buffer 500 to operate with both 1.8 volt and 3.0 volt CMOS I/O signal levels. Furthermore, the separate connections 116 and 114 allow the nonvolatile writeable memory core memory circuit supply voltage to be independent from the output buffer 500 supply voltage. Thus, the separate power supply connections allow for the highest possible noise immunity and isolation between the input and output buffers which, when using lower I/O signal voltage levels, is significant because of decreased noise margins.

FIG. 6 shows a schematic of an alternate embodiment of an interface circuit output buffer 600 of a nonvolatile writeable memory. The inverters 502 and 504 and the parallel combination of the p-channel transistor 516 and the S device 510 have the same functions as previously described with regard to the output buffer 500 of FIG. 5. However, because of process skews in the circuit manufacturing process, it is desirable to be able to trim a circuit for use in numerous particular applications. The additional components 602–612 of the output buffer 600 allow the output buffer 600 to be optimized for speed and noise in a particular application.

The additional components 602–612 of output buffer 600 comprise two additional S devices 602 and 604 in parallel with S device 510. Two S devices are shown for example only, and the number of S devices used in parallel with S device 510 is not limited to two. The additional S devices 602 and 604 increase the rate at which the output signal reaches the level of the VCCQ power supply output 114. Consequently, the more S devices in parallel, the faster the output will reach the level of the VCCQ power supply output 114.

Furthermore, the additional components of the output buffer 600 comprise the NOR logic gates 606 and 608, the content addressable memory 610, and the switch 612. These components 608–612 allow for selective activation of the additional S devices 602 and 604, thereby allowing for selective trimming for particular circuit applications. The content addressable memory 610 is comprised of a number of nonvolatile writeable memory core memory cells. The contents of these core memory cells allow for selective coupling of the output of inverter 502 to the gates of the additional S devices 602 and 604 by use of the NOR logic gates 606 and 608. Therefore, if a particular circuit application results in a variance in the capacitive or inductive effects of the circuit, the number of S devices used in the output buffer of that particular application can be programmably altered to overcome the adverse affects. Accordingly, the speed and noise parameters of the output buffer can be maintained as a relative constant between applications. Thus, a low-power input buffer for nonvolatile writeable memory that is self-configuring to multiple CMOS I/O signal levels has been provided.

Although the detailed description describes embodiments using a flash EPROM, the invention may be used with any nonvolatile writeable memory, including, but not limited to, EPROMs, EEPROMs, and flash memories, including technologies such as NOR, NAND, AND, Divided bit-line NOR (DINOR), and Ferro-electric Random Access Memory (FRAM). While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An input buffer for a memory comprising:

an inverter configured to receive as inputs first and second separately defined logic high levels and a first separately defined logic low level; and a driver configured to translate the output of the inverter to a third separately defined logic high level when the input to the inverter is either the first or second separately defined logic high level and to translate the output of the inverter to a second separately defined logic low level when the input to the inverter is the first separately defined logic low level;

the input buffer being self-configuring to accept as inputs the first and second separately defined logic high levels.

2. The input buffer of claim 1, wherein a circuit with a relatively low voltage drop is coupled to the inverter and to a power supply, the circuit having a threshold voltage, the circuit to prevent leakage current.

3. The input buffer of claim 1, wherein a feedback pull-up device is coupled to the driver and to a power supply, the feedback pull-up device to prevent leakage current.

4. The input buffer of claim 2, wherein the circuit is at least one high transconductance n-channel transistor doped to provide a threshold voltage that is lower than a standard n-channel transistor.

5. The input buffer of claim 4, wherein the threshold voltage is substantially equal to 0.3 volt.

6. The input buffer of claim 1, wherein the first separately defined logic high level is compatible with a first electrical system, the second separately defined logic high level is compatible with a second electrical system, and the first separately defined logic low level is compatible with the first and second electrical systems.

7. The input buffer of claim 6, wherein the first and second electrical systems are complementary metal-oxide semiconductor (CMOS) circuits.

8. The input buffer of claim 1, wherein the first separately defined logic high level equals 1.8 volts, the second separately defined logic high level equals 3.0 volts, the third separately defined logic high level equals 3.0 volts, the first separately defined logic low level equals 0 volt, and the second separately defined logic low level equals 0 volt.

9. The input buffer of claim 1, wherein the driver comprises an inverter having a p-channel transistor and a n-channel transistor, wherein a drain of the p-channel transistor is coupled to a drain of the n-channel transistor, wherein a source of the p-channel transistor is coupled to a power supply and a source of the n-channel transistor is coupled to ground.

10. The input buffer of claim 1, wherein the feedback pull-up device comprises a p-channel transistor, wherein a gate of the p-channel transistor is coupled to an output of the driver, wherein a source of the p-channel transistor is coupled to a power supply, and a drain of the p-channel transistor is coupled as an input to the driver.

11. The input buffer of claim 1, wherein the memory and the input buffer are coupled to a same power supply, the power supply providing a voltage substantially in the range from 2.7 volts to 2.85 volts.

12. The memory of claim 1, wherein the memory is a nonvolatile memory.

13. The memory of claim 12, wherein the memory is a flash memory.

14. A memory comprising:

(1) a memory array;

(2) an input buffer comprising:

an inverter configured to receive as inputs first and second separately defined logic high levels and a first separately defined logic low level; and a driver configured to translate the output of the inverter to a third separately defined logic high level when the input to the inverter is either the first or second separately defined logic high level and to translate the output of the inverter to a second separately defined logic low level when the input to the inverter is the first separately defined logic low level;

the input buffer being self-configuring to accept as inputs the first and second separately defined logic high levels; and (3) the memory array coupled to the input buffer.

15. The memory of claim 14, wherein a circuit with a relatively low voltage drop is coupled to the inverter and to a power supply, the circuit having a threshold voltage, the circuit to prevent leakage current.

16. The memory of claim 14, wherein a feedback pull-up device is coupled to the driver and to a power supply, the feedback pull-up device to prevent leakage current.

17. The memory of claim 15, wherein the circuit is at least one high transconductance n-channel transistor doped to provide a threshold voltage that is lower than a standard n-channel transistor.

18. The memory claim 17, wherein the threshold voltage substantially equal to 0.3 volt.

19. The memory of claim 14, wherein the first separately defined logic high level is compatible with a first electrical system, the second separately defined logic high level is compatible with a second electrical system, and the first separately defined logic low level is compatible with the first and second electrical systems.

20. The memory of claim 19, wherein the first and second electrical systems are complementary metal-oxide semiconductor (CMOS) circuits.

21. The memory of claim 14, wherein the first separately defined logic high level equals 1.8 volts, the second separately defined logic high level equals 3.0 volts, the third separately defined logic high level equals 3.0 volts, the first separately defined logic low level equals 0 volt, and the second separately defined logic low level equals 0 volt.

22. The memory of claim 14, wherein the driver comprises an inverter having a p-channel transistor and a n-channel transistor, wherein a drain of the p-channel transistor is coupled to a drain of the n-channel transistor, wherein a source of the p-channel transistor is coupled to a power supply and a source of the n-channel transistor is coupled to ground.

23. The memory of claim 14, wherein the feedback pull-up device comprises a p-channel transistor, wherein a gate of the p-channel transistor is coupled to an output of the driver, wherein a source of the p-channel transistor is coupled to a power supply, and a drain of the p-channel transistor is coupled as an input to the driver.

24. The memory of claim 14, wherein the memory and the input buffer are coupled to a same power supply, the power supply providing a voltage substantially in the range from 2.7 volts to 2.85 volts.

25. The memory of claim 14, wherein the memory is a nonvolatile memory.

26. The memory of claim 25, wherein the memory is a flash memory.

27. A processing system comprising:
(1) a processor;
(2) a memory comprising:
  (a) a memory array;
  (b) an input buffer comprising:
    an inverter configured to receive as inputs first and second separately defined logic high levels and a first separately defined logic low level; and
    a driver configured to translate the output of the inverter to a third separately defined logic high level when the input to the inverter is either the first or second separately defined logic high level and to translate the output of the inverter to a second separately defined logic low level when the input to the inverter is the first separately defined logic low level;
    the input buffer being self-configuring to accept as inputs the first and second separately defined logic high levels;
  (c) the memory array coupled to the input buffer; and
(3) the processor coupled to the memory.

28. The processing system of claim 27, wherein the first separately defined logic high level equals 1.8 volts, the second separately defined logic high level equals 3.0 volts, the third separately defined logic high level equals 3.0 volts, the first separately defined logic low level equals 0 volt, and the second separately defined logic low level equals 0 volt.

29. The processing system of claim 27, wherein the memory and the input buffer are coupled to a same power supply, the power supply providing a voltage substantially in the range from 2.7 volts to 2.85 volts.

30. The processing system of claim 27, wherein the memory is a nonvolatile memory.

31. The processing system of claim 30, wherein the nonvolatile memory is a flash memory.

\* \* \* \* \*